United States Patent [19]
Robinson

[11] 4,138,739
[45] Feb. 6, 1979

[54] SCHOTTKY BIPOLAR TWO-PORT RANDOM-ACCESS MEMORY

[75] Inventor: Barry J. Robinson, Mountain View, Calif.

[73] Assignee: Fairchild Camera and Instrument Corporation, Mountain View, Calif.

[21] Appl. No.: 846,479

[22] Filed: Oct. 31, 1977

Related U.S. Application Data

[63] Continuation of Ser. No. 714,535, Aug. 16, 1976, abandoned.

[51] Int. Cl.² .............................................. G11C 11/40
[52] U.S. Cl. .................................... 365/174; 365/154; 307/238
[58] Field of Search ......................... 307/238; 365/174

[56] References Cited
U.S. PATENT DOCUMENTS

| | | | |
|---|---|---|---|
| 3,675,218 | 7/1972 | Sechler | 307/238 |
| 3,753,247 | 8/1973 | Rauchman | 307/238 |
| 3,979,735 | 9/1976 | Payne | 307/238 |

OTHER PUBLICATIONS

IBM Tech. Dis. Bul., vol. 14, #6, Nov. 1971, "Fast NDRO memory circuits for integration" R. D. More, p. 1666.

*Primary Examiner*—Terrell W. Fears
*Attorney, Agent, or Firm*—Alan H. MacPherson; Robert C. Colwell; Paul J. Winters

[57] ABSTRACT

High emitter-coupled logic switching speeds and low standby power are achieved with a dual-port RAM cell in which two NPN Schottky transistors in a non-saturable bistable flip-flop configuration are flanked by a second pair of transistors whose collectors are individually coupled to the flip-flop collectors. The two output digit lines of the RAM are individually connected to the emitters of the flanking transistors, and their bases are individually coupled to the two select lines. A read signal on either select line enables a flanking transistor to sense the state of the RAM. Writing is accomplished by applying a high logic signal to both select lines and one digit line while the other digit line is dropped to a low state.

8 Claims, 1 Drawing Figure

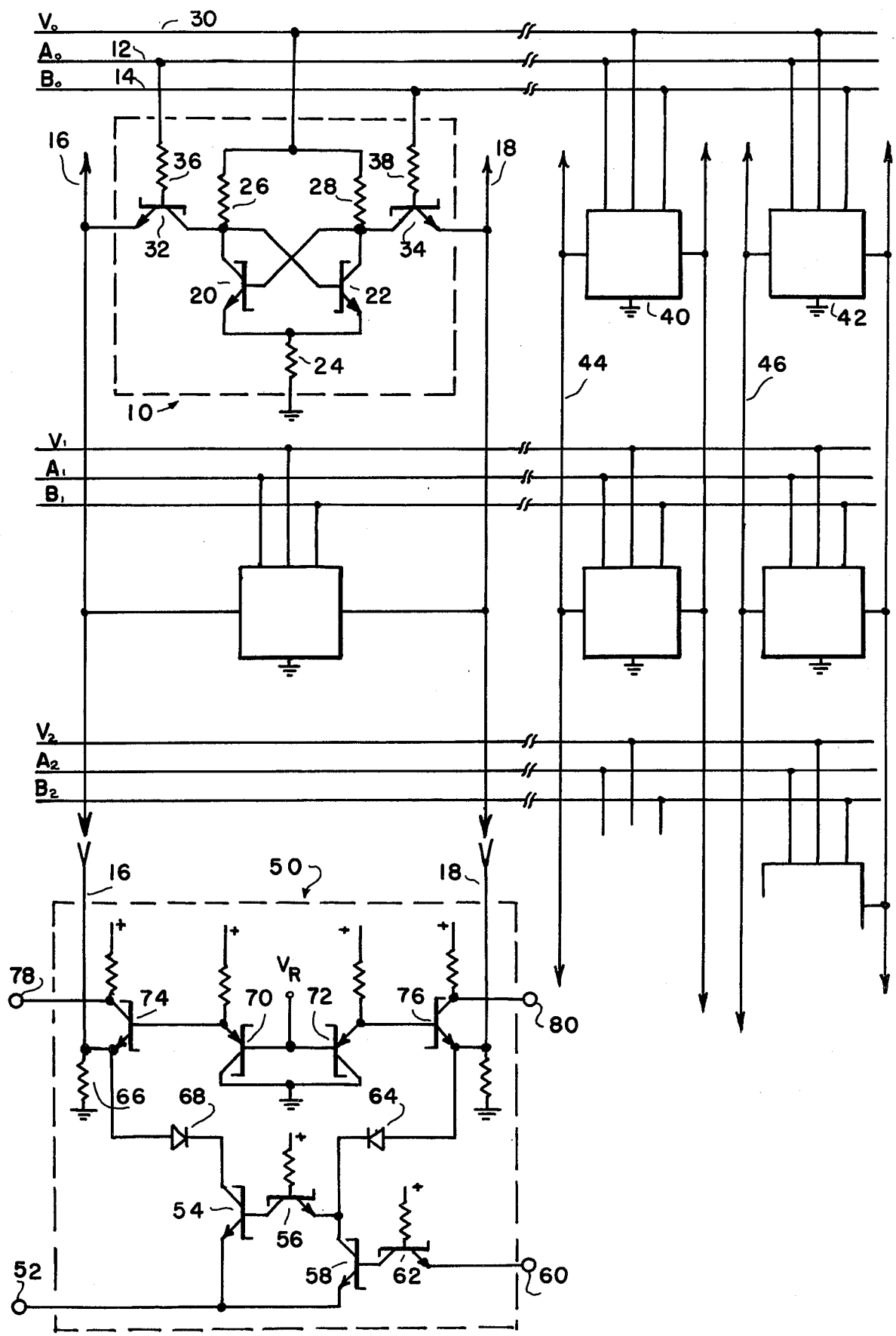

SCHOTTKY BIPOLAR TWO-PORT RANDOM-ACCESS MEMORY

CROSS REFERENCE TO RELATED APPLICATION

This is a continuation of U.S. patent application Ser. No. 714,535, filed Aug. 16, 1976, now abandoned.

BACKGROUND OF THE INVENTION

1. Field of the Invention

This invention relates generally to random access memories (RAM) as used in digital computers, and more particularly to a new and improved circuit for a memory cell of an integrated circuit two-port RAM that may be simultaneously interrogated by either one or both of two "read" signals and which is particularly valuable for use in large integrated circuits because of its very high switching speeds, very low standby current consumption, and small physical size.

2. Description of the Prior Art

Random access memories have been extensively used in digital computing equipment for many years. During this period, the equipment has been greatly reduced in size and increased in speed, and the various components, such as memories, input-output circuits, processing circuitry, and the like, have likewise been improved to the point where a RAM, originally comprising only eight cells each occupying about sixty square mils, are now commercially available on a single small integrated circuit chip and comprise several thousand cells each occupying only about one square mil. More recently, speeds have been vastly increased by the use of the two-port RAM in which the memory may be simultaneously addressed from two separate sources and read out on two different digit lines. These multiport RAMS have generally been in the form of a 90 × 110 mil integrated circuit containing sixteen complete JK flip-flops together with the necessary multiplexing and demultiplexing circuitry. Although relatively small in capacity, these memories are very versatile and have proven to be valuable, for example, as high speed buffer storage between processors, in fast multiplication circuitry, etc. Even more recently there have been attempts at reducing the size of the individual flip-flops making up a cell to thereby increase the storage capacity of the RAM. For example, one such commercially available microprocessor incorporates a two-port RAM having sixty-four memory cells in a sixteen-word by four-bit matrix. Each of the cells includes a two-transistor flip-flop circuit and an additional four transistors, eight resistors and three diodes and requires a total of eight connections to circuitry exterior of the cell. Each cell in the matrix draws nearly about one and one-half milliamperes of standby current, requires an area of about eighty-five square mils, and because of its design and process has an access time of approximately twenty-five nanoseconds.

SUMMARY OF THE INVENTION

While the prior art cell described above provided a substantial advance in the art at the time of its development, the cell of the present invention is substantially faster and simpler in construction, requiring a two-transistor flip-flop but with only two additional transistors, five resistors, and a total of only six connections to outside circuitry. Each cell draws only 0.25 milliamperes of standby current, requires an area of less than thirty-four square mils in dual layer Schottky processing, and has an approximate access time of less than ten nanoseconds from address to output.

Briefly described, the cell of the present invention comprises a pair of NPN Schottky transistors connected into a non-saturable bistable multivibrator configuration. The collector of each transistor is coupled to the collector of a flanking transistor, the emitter of which is connected to the output digit lines of the memory. The bases of the flanking transistors are connected to one of the two select lines so that the "read" signal on either line will enable a flanking transistor to sense the state of the flip-flop. Writing is accomplished by applying high logic signals to both select lines and one bit line, while the second bit line is dropped to a low state.

BRIEF DESCRIPTION OF THE DRAWING

A single FIGURE illustrates a schematic drawing of the memory cell of the invention and further includes a partial block diagram of a typical matrix and the schematic diagram of a typical READ/WRITE circuit for the memory cell of the invention.

DETAILED DESCRIPTION OF THE INVENTION

A schematic diagram of the memory cell of the invention is contained within the dashed lines of the drawing and is identified by the reference numeral 10. Cell 10 comprises only one of many identical cells that may be included in a random access memory. For example, a complete RAM may be very large and may incorporate several thousand cells or may be only a 64-cell memory in which the cells may be arranged in a matrix of sixteen rows of four columns, representing sixteen words of four bits each. Each of the sixteen rows has a pair of select lines, a left-hand select line and a right-hand select line. In such an example, a four bit left-hand address field may be connected through a four-line-to-sixteen-line decoder to the left-hand select lines. Similarly, a four bit right-hand address field may drive the right-hand select lines. Each cell has a pair of digit lines, a left and right, each of which is connected to all of the sixteen cells in the column. A high level signal on a left-hand select line interrogates a row by placing output signals on the left-hand digit lines while a high level signal on a right-hand select line interrogates a row by output signals on the right-hand digit lines. Thus, any two rows may be simultaneously read on the left-hand or right-hand digit lines. If, for example, the same row is selected by high signals on both the right and left-hand select lines, the same word will appear on the right and left-hand digit lines.

In the embodiment illustrated in the drawing, the cell 10 may be interrogated by a positive signal appearing on either select line 12 or select line 14 and the state of the cell 10 will be detected by a corresponding signal on the digit lines 16 or 18, respectively.

Cell 10 includes a pair of Schottky processed NPN transistors 20 and 22. The emitters of transistors 20 and 22 are coupled together and through a relatively high value resistor 24 to ground, thus providing the inherent speed advantage of emitter coupled logic. The collectors of transistors 20 and 22 are respectively coupled through resistance 26 and 28 to a positive potential current source 30. The base of transistor 20 is coupled to the collector of transistor 22, and the base of transistor 22 is coupled to the collector of transistor 22 in a flip-flop configuration, so that, for example, if transistor 20 is conducting current, its collector voltage is low, thereby cutting off the conduction of transistor 22. Conversely, if transistor 22 is conducting, the voltage level appearing on its collector will force transistor 20 to stop conducting.

The state of the memory cell, that is, whether transistor 20 or transistor 22 is conductive or non-conductive, is sensed by the flanking NPN transistors 32 and 34. The emitter of transistor 32 is connected to a first digit line 16 and its collector is connected to the collector of transistor 20. Similarly, the emitter of transistor 34 is connected to the second digit line 18 and its collector is connected to the collector of transistor 22. The base of transistor 32 is connected through a resistance 36 to the "$A_o$" word line 12 and the base of transistor 34 is connected through resistor 38 to the "$B_o$" word line 14.

In operation, either transistor 20 or transistor 22 will always be conducting current as long as adequate current is available from the positive current source 30. The application of a positive "read enable" signal to the select line 12 will enable the flanking transistor 32. If, for example, transistor 20 is conducting current, its collector will be low and no current will be conducted through transistor 32. On the other hand, if transistor 22 is conducting current, transistor 20 will be non-conductive, and the collector of transistor 20 will be high, thereby permitting conduction of current from line 30 through resistor 26 and transistor 32 into the first digit line 16. Similarly, a "read enable" signal applied to the "$A_o$" select line 12 will read the state of all the other cells in the "zero" row, such as the cells 40 and 42, and their particular state will be read out on their associated first digit lines 44 and 46. Referring again to cell 10, the enabling voltage on select line 12 reads out the memory only on digit line 16; digit line 18 is unaffected except by the application of an enabling signal on the "$B_o$" select line 14. If such a signal is applied to line 14, the transistor 34 is enabled and will conduct current into the digit line 18 only if transistor 20 is conductive. It should be noted that the state of the cell 10 may be determined by the application of a read signal on the select line 12 or 14, or upon both lines 12 and 14 simultaneously, if desired. The state of the memory cell is determined merely by the presence or absence of a current flow through the appropriate output digit lines 16 or 18.

Writing into the cell, that is, forcing either transistor 20 or 22 into a desired state regardless of its previous state, is accomplished by applying enabling signals to both the select lines 12 and 14, thereby enabling both of the flanking transistors 32 and 34. If it is desired to force transistor 20 into conduction, a high logic signal is applied to the digit line 18, while a low impedance low logic level signal is applied to the digit line 16. The high level on digit line 18 will prevent conduction through the enabled transistor 34 so that the collector of transistor 22 and the base of transistor 20 will be at their high level. With a low impedance low level signal on the digit line 16, transistor 32 becomes conductive and the resulting low level signal is applied to the base of transistor 22 to force it into its non-conductive state. In a similar way, conduction of transistor 22 may be accomplished by the application of a high signal on the digit line 16 and a corresponding low impedance low signal on the digit line 18.

Illustrated in the drawing is a typical READ/WRITE circuit 50 that may be used with the two-port cell of the invention. The READ/WRITE circuit is not a part of the invention; it is merely being presented as an example of one circuit that may be used to read from and write into the memory cell 10.

A detailed description of the READ/WRITE circuit which is contained within the dashed lines and is identified by the reference numeral 50 will not be provided; however, its operation is as follows: When it is desired to write into the memory cell 10, a low impedance low level "write enable" signal is applied to the terminal 52 thereby enabling the transistors 54, 56 and 58. If the data applied to data input terminal 60 is high, transistor 62 will be non-conductive and a current flow through the Schottky clamped base-collector and into the base of transistor 58 to render that transistor conductive. The collector of transistor 58 is then low and transistor 56 then becomes conductive to cut off conduction of transistor 54. The collector of transistor 58 then draws current through the digit line 18 and through the diode 64 into the low impedance current sink, thereby applying a low signal to the digit line 18. Since transistor 54 was rendered non-conductive by conduction through transistor 56, transistor 74 drives digit line 16 to a high potential since $V_R$ is switched high during writing.

If the data applied to terminal 60 is in a low logic state, transistor 62 is conductive to cut off conduction of transistor 58. When the collector of transistor 58 goes to a high state, the base-emitter junction of transistor 56 becomes non-conductive and a current flows through the Schottky base-collector clamp of transistor 56 to the base of transistor 54 to render it conductive. Then, current through the digit line 16 is drawn through the diode 68 into the low impedance current sink while digit line 18 remains high. It should be noted that circuitry should be provided to assure that the complement of the "write enable" signal to input terminal 52 will also drive the reference voltage, $V_R$, high and force transistors 70 and 72 into non-conduction. The emitters of transistors 70 and 72 then rise to their high potential and this level is applied to the bases of the transistors 74 and 76, respectively, to render them conductive. Therefore, during the write cycle, any writing signals entered into either of the digit lines 16 or 18 are not transferred to the reading circuitry or to the output terminals 78 or 80.

During the reading operation, the "write enable" terminal 52 is at a high level and the transistors 54, 56, 58, 62 and diodes 64 and 68 are not functioning in the circuit. When a read signal is applied to the select line 12, all cells in the horizontal row that are coupled to that line will be read through the left-hand digit line, such as digit line 16, 44 and 46. If the particular cell is set so that current will flow through the digit line 16, that current will be sensed by the READ/WRITE circuit 50. If an interrogation signal is applied to the select line 12, and a resulting current from the cell 10 is applied into the digit line 16, the current is sensed by the transistor 74. During the read operation, the reference voltage to transistors 70 and 72 is applied so that transistors 74 and 76 will conduct or not conduct depending upon the presence or absence of current in the digit lines. If a cell current is applied through digit line 16 to resistor 66, it reverse biases the emitter of transistor 74 and turns it off. The collector of transistor 74 then rises to the level, $V_{cc}$, of the supply. If no cell current flows in digit line 16, the reference voltage coupled through transistor 70 to the base of transistor 74 turns on transistor 74 so that the current flow through the collector resistor results in an IR drop that produces a low level output signal at terminal 78.

What is claimed is:

1. A two-port random-access memory (i.e., RAM) cell comprising:
   first and second NPN transistors, the emitters of said transistors being coupled together, the base of said first transistor being coupled to the collector of said second transistor, the base of said second transistor being coupled to the collector of said first transistor;
   first and second resistors respectively coupled between a positive potential current source and the collectors of said first and second transistors;
   a third resistor coupled between the intercoupled emitters of said first and second transistors and ground reference;
   fourth and fifth resistors;
   first and second select line conductors;
   first and second digit line conductors;
   a third NPN transistor for signalling the state of the RAM cell into said first digit line conductor, the collector of said third transistor being coupled to the collector of said first transistor, the emitter of said third transistor being coupled to said first digit line conductor, and the base of said third transistor being coupled through said fourth resistor to said first select line conductor; and
   a fourth NPN transistor for signalling the state of the RAM cell into said second digit line conductor, the collector of said fourth transistor being coupled to the collector of said second transistor, the emitter of said fourth transistor being coupled to said second digit line conductor, and the base of said fourth transistor being coupled through said fifth resistor to said second select line conductor;
   said third and fourth transistors also operable for changing the state of the RAM cell.

2. The two-port RAM cell claimed in claim 1 wherein said first and second transistors are operated as a non-saturating bistable multivibrator.

3. The two-port RAM cell claimed in claim 1 wherein said first and second transistors are Schottky processed transistors.

4. The two-port RAM cell claimed in claim 1 wherein said third and fourth NPN transistors signal the state of said RAM cell by conducting a current into said first and second digit line conductors.

5. A two-port random-access memory (i.e., RAM) cell comprising:
   first and second NPN transistors, the emitters of said transistors being coupled together, the base of said first transistor being coupled to the collector of said second transistor, the base of said second transistor being coupled to the collector of said first transistor;
   first and second resistors respectively coupled between a positive potential current source and the collectors of said first and second transistors;
   a third resistor coupled between the intercoupled emitters of said first and second transistors and ground reference;
   first and second select line conductors;
   first and second digit line conductors;
   a third NPN transistor for signalling the state of the RAM cell into said first digit line conductor, the collector of said third transistor being coupled to the collector of said first transistor, the emitter of said third transistor being coupled to said first digit line conductor, and the base of said third transistor being coupled to said first select line conductor; and
   a fourth NPN transistor for signalling the state of the RAM cell into said second digit line conductor, the collector of said fourth transistor being coupled to the collector of said second transistor, the emitter of said fourth transistor being coupled to said second digit line conductor, and the base of said fourth transistor being coupled to said second select line conductor;
   said third and fourth transistors also operable for changing the state of the RAM cell.

6. The two-port RAM cell claimed in claim 5 wherein said first and second transistors are operated as a non-saturating bistable multivibrator.

7. The two-port RAM cell claimed in claim 5 wherein said first and second transistors are Schottky processed transistors.

8. The two-port RAM cell claimed in claim 5 wherein said third and fourth NPN transistors signal the state of said RAM cell by conducting a current into said first or second digit line conductors.

* * * * *